(12) United States Patent
Adan

(10) Patent No.: US 12,250,503 B2
(45) Date of Patent: Mar. 11, 2025

(54) PREDICTION OF ELECTRICAL PROPERTIES OF A SEMICONDUCTOR SPECIMEN

(71) Applicant: Applied Materials Israel Ltd., Rehovot (IL)

(72) Inventor: Ofer Adan, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 436 days.

(21) Appl. No.: 17/134,025

(22) Filed: Dec. 24, 2020

(65) Prior Publication Data

US 2022/0210525 A1 Jun. 30, 2022

(51) Int. Cl.
*H04Q 9/00* (2006.01)
*G01R 31/26* (2020.01)
*H01L 21/66* (2006.01)

(52) U.S. Cl.
CPC ............... *H04Q 9/00* (2013.01); *G01R 31/26* (2013.01); *H01L 22/12* (2013.01)

(58) Field of Classification Search
CPC .................................. G01R 31/26; H04Q 9/00
USPC .......................................................... 702/83
See application file for complete search history.

(56) References Cited

U.S. PATENT DOCUMENTS

| | | | |
|---|---|---|---|
| 9,046,475 B2 | 6/2015 | Langer et al. | |
| 2007/0203606 A1* | 8/2007 | Quarg | G06Q 10/06 700/121 |
| 2013/0310960 A1* | 11/2013 | Chang | G05B 19/41865 707/E17.014 |
| 2018/0082826 A1* | 3/2018 | Guha | H01J 37/32082 |
| 2019/0178630 A1* | 6/2019 | Amit | G01B 11/06 |
| 2020/0110390 A1 | 4/2020 | Banna | |
| 2021/0025695 A1* | 1/2021 | Li | G06N 3/04 |

(Continued)

FOREIGN PATENT DOCUMENTS

WO 2018202361 A1 11/2018

OTHER PUBLICATIONS

PCT International Search Report and Written Opinion for International Application No. PCT/IL2021/051287, dated Feb. 25, 2022, 10 pages.

(Continued)

*Primary Examiner* — Ricky Go
(74) *Attorney, Agent, or Firm* — Lowenstein Sandler LLP

(57) ABSTRACT

There is provided a method and a system configured to obtain metrology data $D_{metrology}$ informative of a plurality of structural parameters of a semiconductor specimen, obtain a model informative of a relationship between at least some of said structural parameters and one or more electrical properties of the specimen, use the model and $D_{metrology}$ to determine, for at least one given electrical property of the specimen, one or more given structural parameters among the plurality of structural parameters, which affect the given electrical property according to an impact criterion, and generate a recipe for an examination tool, wherein the recipe enables a ratio between a first acquisition rate of data informative of the one or more given structural parameters, and a second acquisition rate of data informative of other structural parameters of the plurality of structural parameters, to meet a criterion.

20 Claims, 6 Drawing Sheets

(56) References Cited

U.S. PATENT DOCUMENTS

2021/0208512 A1* 7/2021 Calado ............... G03F 7/70633
2021/0334448 A1* 10/2021 Naot .................. G03F 7/70633

OTHER PUBLICATIONS

"Applied MDLX™ Ginestra™ Simulation Software," https://www.appliedmaterials.com/products/applied-mdlx-ginestra-simulation-software, Sep. 26, 2020, 5 pgs.

* cited by examiner

PREDICTION OF ELECTRICAL PROPERTIES OF A SEMICONDUCTOR SPECIMEN

TECHNICAL FIELD

The presently disclosed subject matter relates, in general, to the field of examination of a specimen, and more specifically, to automating the examination of a specimen.

BACKGROUND

Current demands for high density and performance associated with ultra large-scale integration of fabricated devices require submicron features, increased transistor and circuit speeds, and improved reliability. Such demands require formation of device features with high precision and uniformity, which, in turn, necessitates careful monitoring of the fabrication process, including automated examination of the devices while they are still in the form of semiconductor wafers.

Examination processes are used at various steps during semiconductor fabrication to measure dimensions of the specimens, and/or to detect and classify defects on specimens (e.g. Automatic Defect Classification (ADC), Automatic Defect Review (ADR), etc.).

GENERAL DESCRIPTION

In accordance with certain aspects of the presently disclosed subject matter, there is provided a system comprising a processor and memory circuitry (PMC), the PMC being configured to obtain metrology data $D_{metrology}$ informative of a plurality of structural parameters of a semiconductor specimen, obtain a model informative of a relationship between at least some of said structural parameters and one or more electrical properties of the semiconductor specimen, use the model and $D_{metrology}$ to determine, for at least one given electrical property of the specimen, one or more given structural parameters among the plurality of structural parameters, which affect the given electrical property according to an impact criterion, and generate a recipe for an examination tool, wherein the recipe enables a ratio between a first acquisition rate of data informative of the one or more given structural parameters, and a second acquisition rate of data informative of other structural parameters of the plurality of structural parameters, to meet a criterion.

According to some embodiments, the recipe enables acquisition, by the examination tool, of an amount of data informative of each of the one or more given structural parameters which is larger than an amount of data informative of each of the other structural parameters of the plurality of structural parameters.

According to some embodiments, the structural parameters include at least one of parameters informative of a dimension of one or more structural features of the specimen, parameters informative of a shape of one or more structural features of the specimen, parameters informative of a location of one or more structural features of the specimen, and parameters informative of a material of one or more structural features of the specimen.

According to some embodiments, the impact criterion is such that the one or more given structural parameters affect the given electrical property more than other structural parameters of the plurality of structural parameters.

According to some embodiments, the system is configured to obtain electrical measurements informative of the given electrical property of the specimen, use at least the electrical measurements and data informative of the one or more given structural parameters to verify whether the one or more given structural parameters affect the given electrical property according to the impact criterion.

According to some embodiments, the system is configured to send a command to an examination tool to perform examination of said specimen using the recipe, obtain data informative of the one or more given structural parameters, and use the data and the model to predict the given electrical property for the specimen.

According to some embodiments, the system is configured to send a command to an examination tool to perform examination of the specimen using the recipe, obtain data informative of the one or more given structural parameters, and use the data and the model to rework a lithographic process of the specimen.

According to some embodiments, the system is configured to send a command to an examination tool to perform examination of a new specimen using the recipe, obtain metrology data $D_{metrology/new}$ informative of a plurality of structural parameters of the specimen, use the model and $D_{metrology/new}$ to determine, for at least one given electrical property of the specimen, one or more second given structural parameters among the plurality of structural parameters, which affect the given electrical property according to an impact criterion, and update the recipe for examination of the new specimen by the examination tool, wherein the recipe enables a ratio between a first acquisition rate of data informative of the one or more second given structural parameters, and a second acquisition rate of data informative of other structural parameters of the plurality of structural parameters, to meet a criterion.

According to some embodiments, the system is configured to send a command to the examination tool to perform examination of the new specimen according to the updated recipe, obtain data informative of the one or more second given structural parameters of the new specimen, use the data and the model to predict the given electrical property for the new specimen.

According to some embodiments, the system is configured to send a command to an examination tool to perform examination of a new specimen using the recipe, obtain metrology data $D_{metrology/new}$ informative of a plurality of structural parameters of the specimen, use the model and $D_{metrology/new}$ to determine, for at least one given electrical property of the specimen, one or more second given structural parameters among the plurality of structural parameters, which affect the given electrical property according to an impact criterion, and update the recipe for examination of the new specimen by the examination tool, wherein the recipe enables a ratio between a first acquisition rate of data informative of the one or more second given structural parameters, and a second acquisition rate of data informative of other structural parameters of the plurality of structural parameters, to meet a criterion.

According to some embodiments, the system is configured to send a command to the examination tool to perform examination of the new specimen according to the updated recipe, obtain data informative of the one or more second given structural parameters of the new specimen, and use the data and the model to predict the given electrical property for the new specimen.

According to some embodiments, the system is configured to send a command to the examination tool to perform examination of the new specimen according to the updated recipe, obtain data informative of the one or more second given structural parameters, use the data and the model to rework a lithographic process of the new specimen.

According to some embodiments, the specimen comprises a first feature formed in a first layer by a first lithographic process, a second feature formed in a second layer buried under the first layer and formed by a second lithographic process prior to the first lithographic process, the system being configured to control an examination tool to direct electrons of a primary electron beam to interact with the first feature, direct electrons of the primary electron beam to interact with the second feature, generate detection signals responsive to electrons that were scattered or reflected from at least one of the first and second features, and determine at least one spatial relationship between the first feature and the second feature using at least the detection signals.

According to some embodiments, a ratio between the first acquisition rate of data informative of the one or more given structural parameters and the second acquisition rate of data informative of other structural parameters, depends on data informative of a variation of the one or more given structural parameters over a plurality of specimens.

In accordance with certain aspects of the presently disclosed subject matter, there is provided a method comprising, by a processor and memory circuitry (PMC): obtaining metrology data $D_{metrology}$ informative of a plurality of structural parameters of a semiconductor specimen, obtaining a model informative of a relationship between at least some of said structural parameters and one or more electrical properties of the specimen, using the model and $D_{metrology}$ to determine, for at least one given electrical property of the specimen, one or more given structural parameters among the plurality of structural parameters, which affect the given electrical property according to an impact criterion, and generating a recipe for an examination tool, wherein the recipe enables a ratio between a first acquisition rate of data informative of the one or more given structural parameters, and a second acquisition rate of data informative of other structural parameters of the plurality of structural parameters, to meet a criterion.

According to some embodiments, the recipe enables acquisition, by the examination tool, of an amount of data informative of each of the one or more given structural parameters which is larger than an amount of data informative of each of the other structural parameters of the plurality of structural parameters.

According to some embodiments, the structural parameters include at least one of parameters informative of a dimension of one or more structural features of the specimen, parameters informative of a shape of one or more structural features of the specimen, parameters informative of a location of one or more structural features of the specimen, and parameters informative of a material of one or more structural features of the specimen.

According to some embodiments, the impact criterion is such that the one or more given structural parameters affect the given electrical property more than other structural parameters of the plurality of structural parameters.

According to some embodiments, the method comprises sending a command to an examination tool to perform examination of said specimen using the recipe, obtaining data informative of the one or more given structural parameters, and using the data and the model to predict the given electrical property for the specimen.

According to some embodiments, the method comprises sending a command to an examination tool to perform examination of the specimen using the recipe, obtaining data informative of the one or more given structural parameters, and using the data and the model to rework a lithographic process of the specimen.

According to some embodiments, the method comprises sending a command to an examination tool to perform examination of a new specimen using the recipe, obtaining metrology data $D_{metrology/new}$ informative of a plurality of structural parameters of the specimen, using the model and $D_{metrology/new}$ to determine, for at least one given electrical property of the specimen, one or more second given structural parameters among the plurality of structural parameters, which affect the given electrical property according to an impact criterion, and updating the recipe for examination of the new specimen by the examination tool, wherein the recipe enables a ratio between a first acquisition rate of data informative of the one or more second given structural parameters, and a second acquisition rate of data informative of other structural parameters of the plurality of structural parameters, to meet a criterion.

In accordance with certain other of the presently disclosed subject matter, there is provided a non-transitory computer readable medium comprising instructions that, when executed by a processor, cause the processor to perform operations as described above.

Among advantages of certain embodiments of the presently disclosed subject matter is to understand correlation between metrology data and electrical properties of a specimen. According to some embodiments, the proposed solution is dynamic and offers continuous learning. According to some embodiments, the proposed solution provides a smart and focused acquisition of metrology data of a specimen which is relevant for predicting electrical properties of the specimen. According to some embodiments, the proposed solution is operative even if the manufacturing process of the specimen is complex and involves multiple different parameters. According to some embodiments, the proposed solution enables to predict electrical properties of a specimen even at an early stage of the manufacturing line. According to some embodiments, the proposed solution enables to predict electrical properties using on-device measurements of the specimen. According to some embodiments, the proposed solution enables to rework a lithographic process of the specimen. According to some embodiments, the proposed solution improves yield of the manufacturing line.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
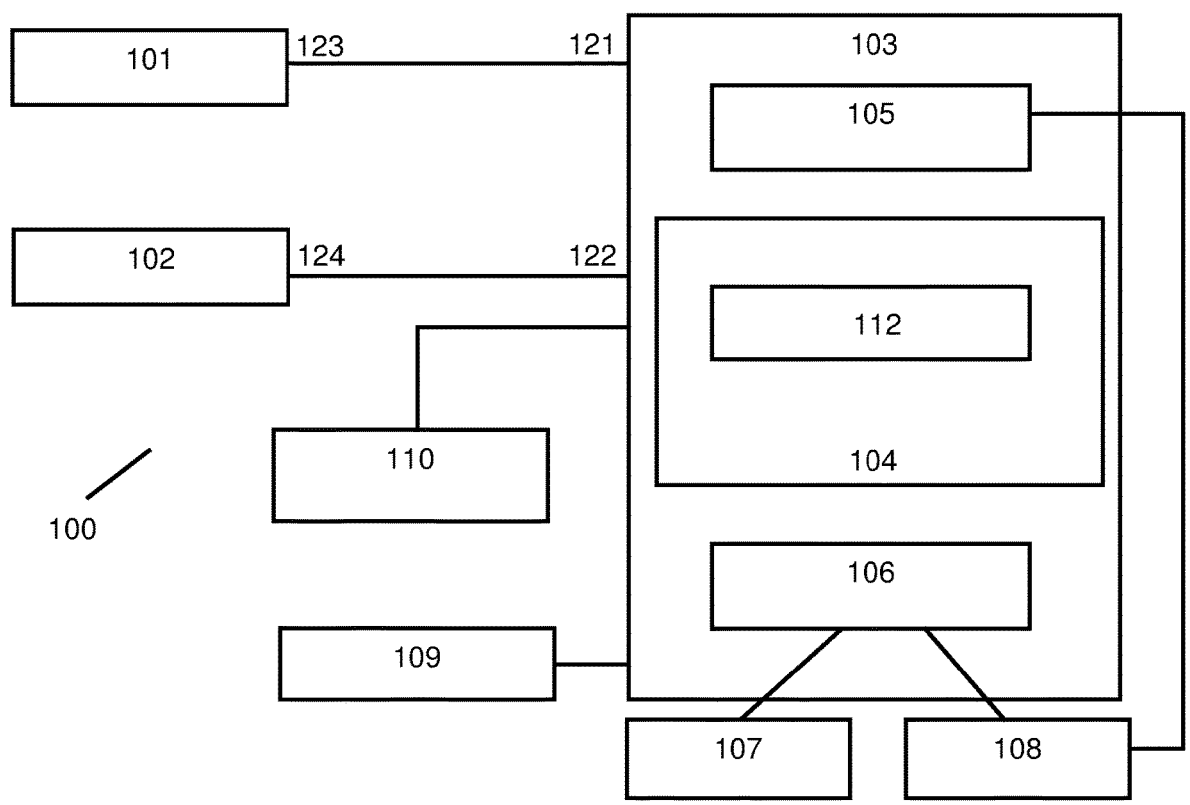
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "obtaining", "using", "sending", "determining", "generating", "updating", "enabling", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the system 103 and respective parts thereof disclosed in the present application.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined and can include, for example, generating an examination recipe(s) and/or other setup operations. It is noted that, unless specifically stated otherwise, the term "examination" or its derivatives used in this specification are not limited with respect to resolution or size of an inspection area.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats such as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter. The examination system 100 illustrated in FIG. 1 can be used for examination of a specimen (e.g. of a wafer and/or parts thereof) as part of the specimen fabrication process. The illustrated examination system 100 comprises computer-based system 103 capable of automatically determining metrology-related information (and if necessary, defect-related information) using images obtained during specimen fabrication. System 103 can be operatively connected to one or more low-resolution examination tools 101 and/or one or more high-resolution examination tools 102 and/or other examination tools. The examination tools are configured to capture images and/or to review the captured image(s) and/or to enable or provide measurements related to the captured image(s). System 103 can be further operatively connected to CAD server 110 and data repository 109.

System 103 includes a processor and memory circuitry (PMC) 104 operatively connected to a hardware-based input interface 105 and to a hardware-based output interface 106. PMC 104 is configured to provide all processing necessary for operating the system 103 as further detailed hereinafter (see methods described in FIGS. 2, 2A, 3, 3A and 3B, which can be performed at least partially by system 103) and includes a processor (not shown separately) and a memory (not shown separately). The processor of PMC 104 can be configured to execute several functional modules in accordance with computer-readable instructions implemented on a non-transitory computer-readable memory comprised in the PMC. Such functional modules are referred to hereinafter as comprised in the PMC. Functional modules comprised in PMC 104 include a deep neural network (DNN) 112. DNN 112 is configured to enable data processing using a machine learning algorithm for outputting application-related data based on the images of specimens.

By way of a non-limiting example, the layers of DNN 112 can be organized in accordance with Convolutional Neural Network (CNN) architecture, Recurrent Neural Network architecture, Recursive Neural Networks architecture, Generative Adversarial Network (GAN) architecture, or otherwise. Optionally, at least some of the layers can be organized in a plurality of DNN sub-networks. Each layer of the DNN can include multiple basic computational elements (CE), typically referred to in the art as dimensions, neurons, or nodes.

Generally, computational elements of a given layer can be connected with CEs of a preceding layer and/or a subsequent layer. Each connection between a CE of a preceding layer and a CE of a subsequent layer is associated with a weighting value. A given CE can receive inputs from CEs of a previous layer via the respective connections, each given connection being associated with a weighting value which can be applied to the input of the given connection. The weighting values can determine the relative strength of the connections and thus the relative influence of the respective inputs on the output of the given CE. The given CE can be configured to compute an activation value (e.g. the weighted sum of the inputs) and further derive an output by applying an activation function to the computed activation. The activation function can be, for example, an identity function, a deterministic function (e.g., linear, sigmoid, threshold, or the like), a stochastic function, or other suitable function. The output from the given CE can be transmitted to CEs of a subsequent layer via the respective connections. Likewise, as above, each connection at the output of a CE can be associated with a weighting value which can be applied to the output of the CE prior to being received as an input of a CE of a subsequent layer. Further to the weighting values, there can be threshold values (including limiting functions) associated with the connections and CEs.

The weighting and/or threshold values of DNN 112 can be initially selected prior to training, and can be further iteratively adjusted or modified during training to achieve an optimal set of weighting and/or threshold values in a trained DNN. After each iteration, a difference (also called a loss function) can be determined between the actual output produced by DNN 112 and the target output associated with the respective training set of data. The difference can be referred to as an error value. Training can be determined to be complete when a cost or loss function indicative of the error value is less than a predetermined value, or when a limited change in performance between iterations is achieved. Optionally, at least some of the DNN subnetworks (if any) can be trained separately, prior to training the entire DNN.

System 103 is configured to receive, via input interface 105, input data. Input data can include data (and/or derivatives thereof and/or metadata associated therewith) produced by the examination tools and/or data produced and/or stored in one or more data repositories 109 and/or in CAD server 110 and/or another relevant data depository. It is noted that input data can include images (e.g. captured images, images derived from the captured images, simulated images, synthetic images, etc.) and associated numeric data (e.g. metadata, hand-crafted attributes, etc.). It is further noted that image data can include data related to a layer of interest and/or to one or more other layers of the specimen.

System 103 is further configured to process at least some of the received input data and send, via output interface 106, the results (or some thereof) to a storage system 107, to examination tool(s), to a computer-based graphical user interface (GUI) 108 for rendering the results and/or to external systems (e.g. Yield Management System (YMS) of a FAB). GUI 108 can be further configured to enable user-specified inputs related to operating system 103.

By way of non-limiting example, a specimen can be examined by one or more low-resolution examination machines 101 (e.g. an optical inspection system, low-resolution SEM, etc.). The resulting data (referred to hereinafter as low-resolution image data 121), informative of low-resolution images of the specimen, can be transmitted—directly or via one or more intermediate systems—to system 103. Alternatively, or additionally, the specimen can be examined by a high-resolution machine 102 (e.g. a scanning electron microscope (SEM) and/or Atomic Force Microscopy (AFM)). The resulting data (referred to hereinafter as high-resolution image data 122), informative of high-resolution images of the specimen, can be transmitted—directly or via one or more intermediate systems—to system 103.

It is noted that image data can be received and processed together with metadata (e.g. pixel size, text description of defect type, parameters of image capturing process, etc.) associated therewith.

Upon processing the input data (e.g. low-resolution image data and/or high-resolution image data, optionally together with other data as, for example, design data, synthetic data, etc.), system 103 can send the results (e.g. instruction-related data 123 and/or 124) to any of the examination tool(s), store the results (e.g. defect attributes, defect classification, etc.) in storage system 107, render the results via GUI 108 and/or send them to an external system (e.g. to YMS).

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in other embodiments at least one of examination tool 102, system 107 and/or GUI 108 can be external to the examination system 100 and operate in data communication with system 103 via input interface 105 and output interface 106. System 103 can be implemented as stand-alone computer(s) to be used in conjunction with the examination tools. Alternatively, the respective functions of the system can, at least partly, be integrated with one or more examination tools.

Figure 2:
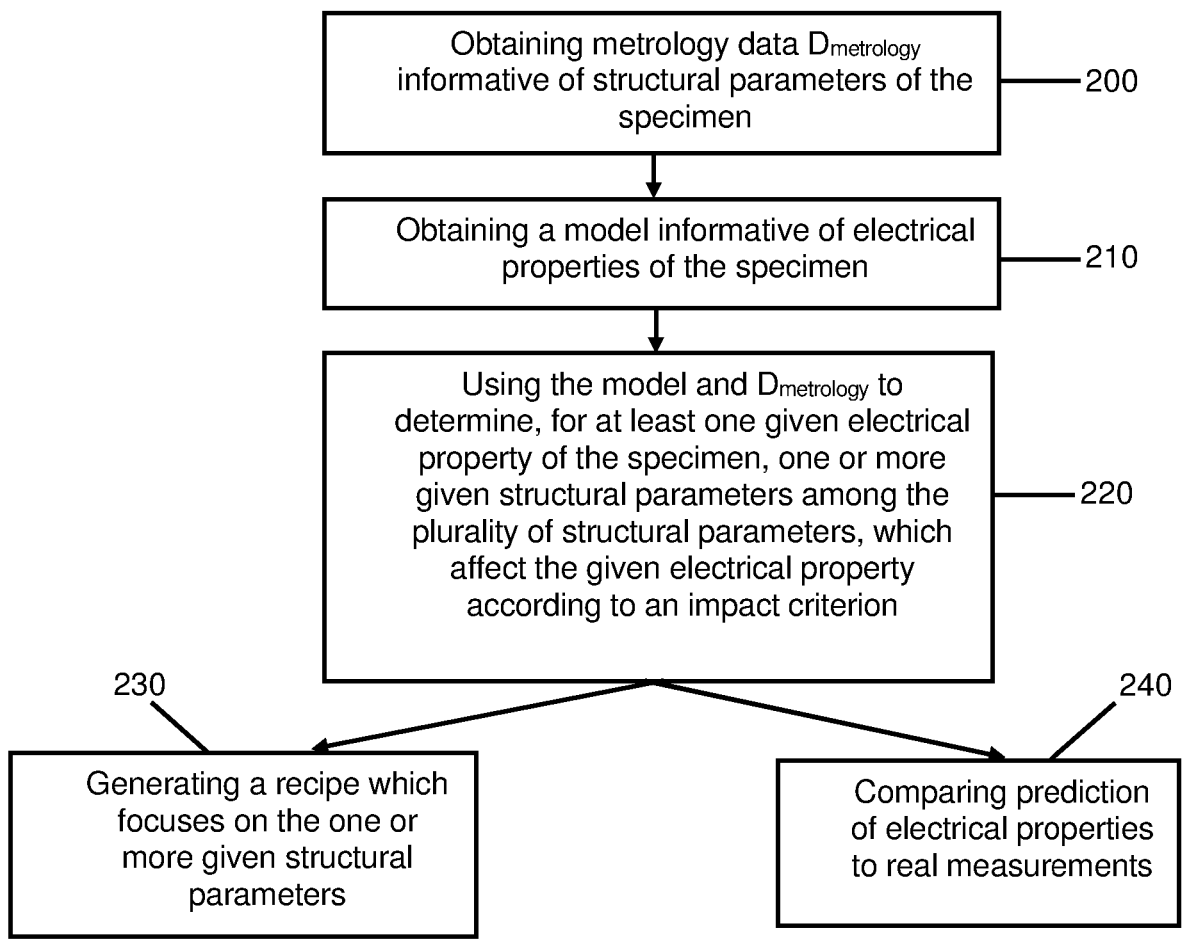
FIG. 2 illustrates a generalized flow-chart of a method of examination of a specimen, which can be performed e.g. during a training phase.

Attention is now drawn to FIG. 2, which describes a training phase, which can be performed before a run-time phase.

The method of FIG. 2 includes obtaining (operation 200) metrology data $D_{metrology}$ informative of a plurality of structural parameters of a semiconductor specimen. If the specimen includes a plurality of layers, data informative of structural parameters can be acquired for all or at least some of the layers.

The structural parameters can include at least one of the parameters informative of a dimension or a shape of structural features of the specimen and parameters informative of a location of structural features of the specimen. For example, $D_{metrology}$ is informative of structural parameters which include e.g. critical dimensions (CD), critical dimension uniformity (CDU), overlay, edge placement error, three-dimensional profile, shapes of structural features, process variation error, etc.

At least part of $D_{metrology}$ can be acquired/determined by an examination tool such as an optical examination and/or an electron beam examination tool. In some embodiments, the examination tool can be a high-resolution examination tool (see reference 102, which corresponds e.g. to a scanning electron microscope (SEM)). If necessary, system 103 can further process data (e.g. images and/or metadata of the images) provided by the examination tool to determine data $D_{metrology}$.

According to some embodiments, $D_{metrology}$ is informative of structural parameters which include data informative of material(s) of the specimen (e.g. of material(s) used to manufacture structural features of the specimen). This can include e.g. type of material, stoichiometry variations, atomic defects, interfaces, and material morphology. These parameters can be measured e.g. using an electron examination tool which includes a material sensitive detector. When the electron examination tool illuminates the specimen with an electron beam, interaction of the electrons with the specimen provides a characteristic photon which can be sensed by a detector. The reflected photon is informative of properties of the material of the specimen (e.g. X-ray photons are informative of properties of the material).

The method of FIG. 2 includes (operation 210) obtaining a model informative of electrical properties of the specimen. In particular, the model can be informative of a relationship between (one or more) structural parameters (as mentioned above) of the specimen (such as materials, dimensions/locations/3D profile of structural features, etc.) and one or more electrical properties of the specimen. Examples of electrical properties include transient, pulse, and DC characteristics (e.g. voltage, current, capacitance, conductance, etc.), carrier transport, charge trapping and emission, etc.

According to some embodiments, the model can be generated using Ginestra™ Simulation Software. This software is described e.g. in https://www.appliedmaterials.com/products/applied-mdlx-ginestra-simulation-software (content and documents cited in this link are incorporated herein by reference). This is not limitative and other electrical models can be used (for example, an electrical model can be built using correlation techniques, etc.).

The method further includes (operation 220) using the model and $D_{metrology}$ to determine, for at least one given electrical property of the specimen, one or more given structural parameters among the plurality of structural parameters, which affect the given electrical property according to an impact criterion. In some embodiments, a variation of the one or more given structural parameters with respect to design data affect the given electrical property according to the impact criterion.

In particular, the impact criterion can define that the one or more given structural parameters (and/or a variation thereof with respect of design data) affect the given electrical property of the specimen more than a variation in other structural parameters (and/or a variation thereof with respect to design data) of the plurality of structural parameters.

In other words, according to some embodiments, variations in the given electrical property (e.g. with respect to expected or design electrical property) best correlate to variations in the one or more given structural parameters than to variations in other structural parameters. Behavior of the one or more given structural parameters has been identified as being strongly linked to behavior of the given electrical property. Therefore, the one or more given structural parameters are more relevant than other structural parameters for analyzing behavior of the given electrical property of the specimen.

In some embodiments, the impact criterion can define that a level of correlation between the one or more given structural parameters and the given electrical property is above a predefined threshold.

Although a given electrical property has been referred to above, this applies similarly to a plurality of different given electrical properties. For each given electrical property, a set of one or more given structural parameters can be identified as affecting the given electrical property according to an impact criterion (the impact criterion may be different for each given electrical property).

Figure 2A:
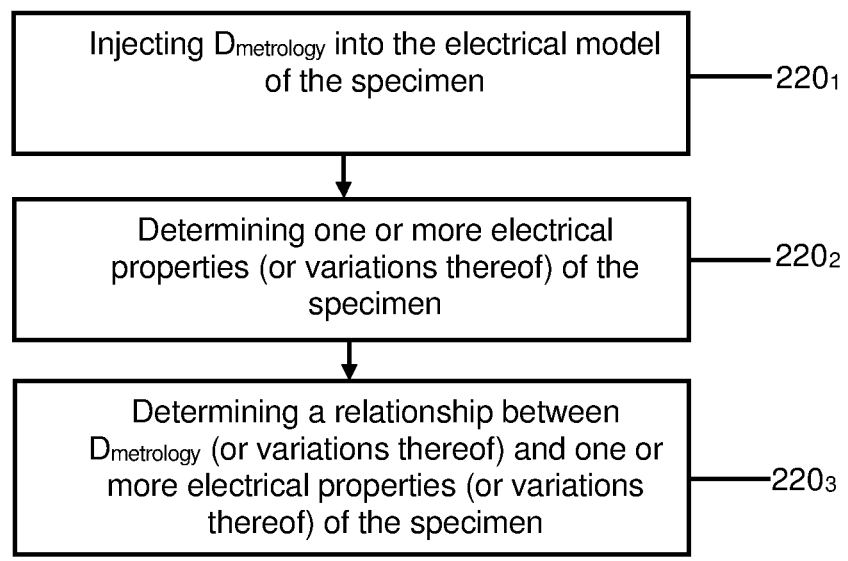
FIG. 2A illustrates a method of determining a relationship between one or more structural parameters of a specimen and one or more electrical properties of a specimen.

FIG. 2A depicts possible operations that can be performed at operation 220. The method of FIG. 2A can include injecting (operation $220_1$) data $D_{metrology}$ informative of a plurality of structural parameters of the specimen, or variations thereof with respect to design data into the electrical model (as obtained at operation 210). The electrical model estimates one or more electrical properties associated with $D_{metrology}$ (operation $220_2$).

The method of FIG. 2A can further include (operation $220_3$) performing an analysis to determine a relationship between the one or more estimated electrical properties (or variations thereof with respect to design electrical properties) and data $D_{metrology}$ informative of a plurality of structural parameters of the specimen (or variations thereof with respect to design data).

Operation $220_3$ can include performing a multi-variable analysis. The multi-variable analysis receives as input:
  data $D_{metrology}$ informative of a plurality of structural parameters of the specimen, and/or variations thereof with respect to design data;
  one or more estimated electrical properties of the specimen (as estimated by the model), and/or variations thereof with respect to design electrical properties (for these one or more electrical properties, it is desired to understand correlation with structural parameters of the specimen).

According to some embodiments, the multi-variable analysis can also receive, as an input, real electrical measurements of one or more electrical properties of the specimen.

According to some embodiments, the multi-variable analysis includes performing various correlation analysis (e.g. linear correlation analysis) between $D_{metrology}$ (or variations thereof) and electrical properties (or variations thereof) of the specimen. In some embodiments, a correlation analysis is performed independently between each of the one or more electrical properties, and each of the one or more structural parameters.

According to some embodiments, the multi-variable analysis includes using a machine learning network, such as a deep neural network (e.g. DNN 112), to determine the relationship between one or more electrical properties of the specimen and one or more structural parameters of the specimen. The machine learning network receives, as an input:
  data $D_{metrology}$ informative of a plurality of structural parameters of the specimen, and/or variations thereof with respect to design data;
  one or more estimated electrical properties of the specimen (as estimated by the model), and/or variations thereof with respect to design electrical properties (for these one or more electrical properties, it is desired to understand correlation with structural parameters of the specimen). In some embodiments, real electrical measurements of electrical properties of the specimen are provided.

In some embodiments, training of the machine learning network is supervised. In particular, a physical model can be provided to the machine learning network. The physical model provides e.g. indications on physical correlations (e.g. between electrical properties and structural parameters of the specimen), which help the machine learning network to better predict the relationship between electrical properties and structural features of the specimen. For example, the physical model indicates that capacitance is a function of an area of the specimen, etc. The physical model corrects the output of the deep neural network e.g. in case the deep neural network performs overfitting when performing the multi-variable analysis.

The method of FIG. 2 further includes generating (operation 230) a recipe (examination recipe) for an examination tool.

Assume that it has been determined at operation 220, that for a given electrical property of the specimen, one or more given structural parameters affect this given electrical property according to the impact criterion. In particular, this can correspond to the fact that the one or more given structural parameters affect this given electrical property more than other structural parameters.

The recipe can be generated to focus data acquisition, by the examination tool, on the one or more given structural parameters, or data informative thereof.

In particular, the recipe enables a ratio between a first acquisition rate of data informative of the one or more given structural parameters, and a second acquisition rate of data informative of other structural parameters of the plurality of structural parameters to meet a criterion. This criterion can define e.g. that the first acquisition rate is higher than the second acquisition rate. The acquisition rate is informative in particular of the number of samples which are acquired and/or of the number of samples per unit of time which are acquired.

In some embodiments, the first acquisition rate can be larger than the second acquisition rate by a predefined value, which can be e.g. selected by an operator.

In some embodiments, assume that N structural parameters $P_1$ to $P_N$ are analyzed. Assume that the given structural parameter (which affects the given electrical property according to the impact criterion) corresponds to parameter $P_2$. In some embodiments, the recipe enables that the acquisition rate of data informative of $P_2$ is larger than the acquisition rate of data informative of $P_1$, larger than the acquisition rate of data informative of $P_3$, . . . , and larger than the acquisition rate of data informative of $P_N$. This example is not limitative. In other words, this corresponds to the fact the acquisition rate of data informative of each of the given structural parameters is larger than the acquisition rate of data informative of each of the other structural parameters.

According to some embodiments, the ratio meets the criterion when the number of samples (amount of data) which are acquired for the one or more given structural parameters, is larger than the number of samples (amount of data) acquired for data informative of each of the other structural parameters. In some embodiments, this corresponds to the fact the amount of data informative of each of the given structural parameters is larger than the amount of data informative of each of the other structural parameters.

In some embodiments, operation 230 can take into account variation of the one or more given structural parameters over a plurality of specimens. Variation of the one or more given structural parameters can be measured using e.g. an adapted statistical indicator, and can be compared e.g. to a threshold. For example, standard deviation of the given structural parameter with respect to other specimens can be determined. This is however not limitative. If a given structural parameter has been identified as stable over a plurality of specimens, then although it has been determined as impacting the one or more given electrical properties according to the impact criterion, an acquisition rate of data informative of this given structural parameter does not need to be increased relative to an acquisition rate of other structural parameters (since its value can be predicted from other specimens). To the contrary, if the given structural parameter has been identified as both impacting the given electrical property, and as varying among the specimens, its acquisition rate can be increased or set as larger than an acquisition rate of each of the other structural parameters.

According to some embodiments, assume that metrology data $D_{metrology}$ (obtained at operation 200) has been acquired with a previous recipe which enabled acquisition of data informative of the one or more given structural parameters with a previous first acquisition rate and acquisition of data informative of other structural parameters of the plurality of structural parameters with a previous second acquisition rate. The criterion can define that the recipe generated at operation 230 enables at least one of:

acquisition of data informative of the one or more given structural parameters with a new first acquisition rate which is larger than the previous first acquisition rate;

acquisition of data informative of the other structural parameters with a new second acquisition rate which is lower than the previous second acquisition rate.

According to some embodiments, the recipe enables the examination tool to devote more time to acquire data informative of the one or more given structural parameters, with respect to data informative of other parameters of the plurality of structural parameters.

If a plurality of given structural parameters has been identified, the first acquisition rate is not necessarily the same for each of the given structural parameters. Similarly, the second acquisition rate is not necessarily the same for each of the other structural parameters.

Since data acquisition by the examination tool is, in practice, limited (because e.g. of time and/or cost constraints), data acquisition is focused on data which has an impact on electrical properties (which are of interest) of the specimen. A smart sampling is therefore achieved.

As mentioned with reference to operation $220_2$, a model of the specimen is used to predict one or more electrical properties (or variations thereof with respect to expected properties) of the specimen based on data $D_{metrology}$ (or variations thereof with respect to design data).

According to some embodiments, the method of FIG. 2 can include comparing (operation 240) prediction of one or more electrical properties of the specimen with real measurements of these electrical properties. Depending on a level of match between them, it can be determined to which extent the relationship (determined at operation $220_3$) and/or the model (obtained at operation 210) are valid. According to some embodiments, if the level of match does not meet a criterion, the method can be repeated (e.g. on the same specimen and/or on another specimen).

The method of FIG. 2, which, as mentioned above, can be performed during a training phase, can be repeated on a plurality of specimens.

Figure 3:
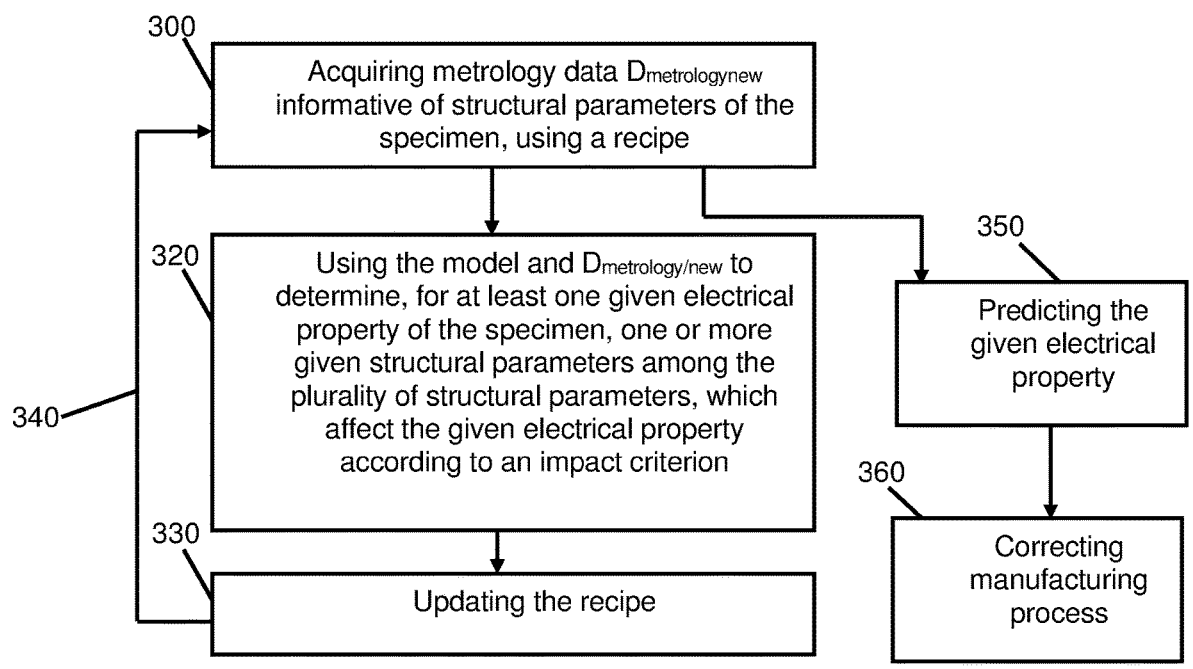
FIG. 3 illustrates a generalized flow-chart of a method of examination of a specimen, which can be performed e.g. during a run-time phase.

Attention is now drawn to FIG. 3.

The method of FIG. 3 can be performed e.g. during a run-time phase. In some embodiments, it can be performed during real time examination of a specimen.

The method includes acquiring (operation 300) metrology data $D_{metrology}$ informative of a plurality of structural parameters of a semiconductor specimen. Examples of data $D_{metrology}$ have already been provided with reference to operation 200.

At least part of $D_{metrology}$ can be acquired by an examination tool, such as an optical examination and/or an electron beam examination tool. In some embodiments, the examination tool can be a high-resolution examination tool (e.g. SEM). In some embodiments, at least part of $D_{metrology}$ can be acquired by a detector (e.g. photon detector) sensitive to material, as mentioned above.

In some embodiments, at least one first specimen which is examined during run-time, and at least one second specimen which has been used during the training phase (see FIG. 2), are similar according to a similarity criterion. The similarity criterion can define, for example, that the first specimen (or at least a first area thereof) and the second specimen (or at least a second area thereof) include the same physical components or include similar zones of the semiconductor specimen (e.g. similar dies, cells, etc.).

Acquisition can be performed by the examination tool in compliance with the recipe as generated in the training phase (see FIG. 2). In particular, a command can be sent to the examination tool to perform examination according to the recipe. As a consequence, metrology data $D_{metrology/new}$ is obtained. $D_{metrology/new}$ mainly includes data informative of the one or more given structural parameters (data informative of other structural parameters can be also obtained, but, as mentioned above, an acquisition/sampling rate of data informative of the one or more given structural parameters can be selected to be larger than for data informative of other structural parameters). The recipe enables to focus data acquisition by the examination tool on structural parameters which are relevant for the at least one given electrical property which is to be analyzed (or for a plurality of given electrical properties which are to be analyzed).

The method further includes (operation 320) using the model (this model has been obtained during the training phase at operation 210) and $D_{metrology/new}$ to determine, for at least one given electrical property of the specimen, one or more given structural parameters among the plurality of structural parameters, which affect the given electrical property according to an impact criterion. The impact criterion can be the same as the impact criterion defined at operation 220, and therefore is not described again.

Operation 320, which can be performed during run-time examination of the specimen, is similar to operation 220 performed during the training phase.

Although operation 220 has been already performed during a training phase, performing operation 320 (during a run-time phase) can provide several benefits. Indeed, the structural parameters which affect the given electrical property can evolve over time (even for the same specimen). For example, assume that during the training phase, it has been determined that given structural parameters $P_1$ to $P_3$ (among parameters $P_1$ to $P_N$) are the most relevant structural parameters for the given electrical property. During run-time, it can be discovered that parameters $P_1$, $P_2$ and $P_4$ are now the most relevant parameters for the given electrical property. This example is not limitative.

Figure 3A:
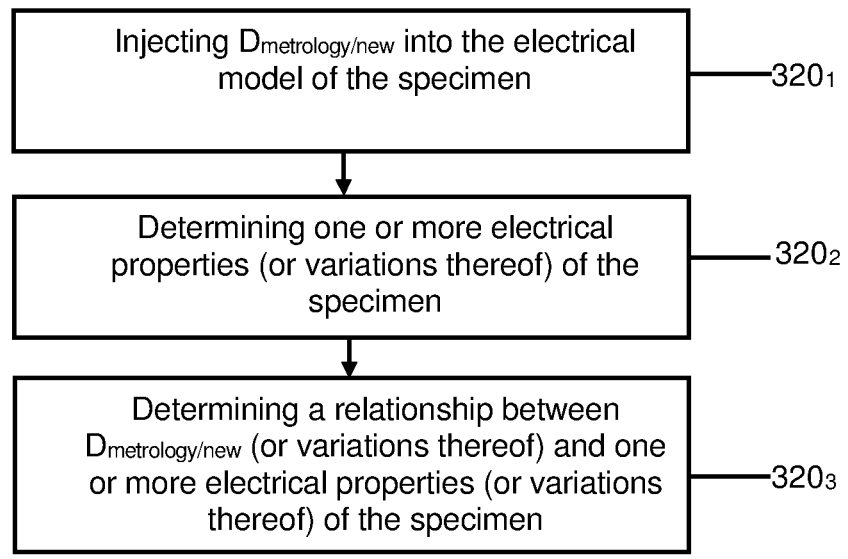
FIG. 3A illustrates a method of determining a relationship between one or more structural parameters of a specimen and one or more electrical properties of a specimen.

According to some embodiments, operation 320 can include operations described in FIG. 3A.

The method of FIG. 3A can include injecting (operation $320_1$) data $D_{metrology/new}$ informative of a plurality of structural parameters of the specimen, or variations thereof with respect to design data, into the electrical model (the electrical model has been obtained at operation 210). The electrical model estimates one or more electrical properties (including e.g. the given electrical property as mentioned above) of the specimen associated with $D_{metrology/new}$ (operation $320_2$).

The method of FIG. 3A can further include (operation $320_3$) performing an analysis to determine a relationship between the estimated one or more electrical properties (or variations thereof with respect to design electrical properties) and data $D_{metrology/new}$ informative of a plurality of structural parameters of the specimen, or variations thereof with respect to design data. Operation $320_3$ can include performing a multi-variable analysis. Operation $320_3$ is similar to operation $220_3$ and is not described again.

The method of FIG. 3 further includes updating (operation 330) the recipe. As mentioned above, it can occur that structural parameters (different from the ones identified during the training phase) are identified at operation 320 as affecting a given electrical property. Therefore, the recipe is updated to take into account the results of this analysis.

Assume that at operation 320, it has been identified that second given structural parameters affect a given electrical property according to the impact criterion. The recipe can be updated to enable a ratio between a first acquisition rate informative of data informative of the one or more second given structural parameters, and a second acquisition rate of data informative of other structural parameters of the plurality of structural parameters to meet a criterion. In particular, the first acquisition rate can be higher than the second acquisition rate. In some embodiments, the first acquisition rate of data informative of each of the one or more second given structural parameters, is larger than the second acquisition rate of data informative of each of the other structural parameters of the plurality of structural parameters.

According to some embodiments, the ratio meets the criterion when the number of samples (amount of data), which are acquired for the one or more second given structural parameters, is larger than the number of samples (amount of data) acquired for data informative of other structural parameters. In some embodiments, the amount of data informative of each of the one or more second structural parameters is larger than the amount of data informative of each of the other structural parameters.

According to some embodiments, assume that metrology data $D_{metrology/new}$ (obtained at operation 300) has been acquired with a recipe which enabled acquisition of data informative of the one or more second given structural parameters with a previous first acquisition rate, and acquisition of data informative of other structural parameters of the plurality of structural parameters with a previous second acquisition rate. The criterion can define that the recipe generated at operation 330 enables at least one of:

acquisition of data informative of the one or more second given structural parameters with a new first acquisition rate which is higher than the previous first acquisition rate;

acquisition of data informative of the other structural parameters with a new second acquisition rate which is lower than the previous second acquisition rate.

According to some embodiments, the recipe enables the examination tool to devote more time to acquire data informative of the one or more second given structural parameters, which respect to data informative of other parameters of the plurality of structural parameters.

According to some embodiments, operation 330 can take into account variation of the one or more second given structural parameters over a plurality of specimens. Variation of the one or more second given structural parameters can be measured using e.g. an adapted statistical indicator, and can be compared e.g. to a threshold. For example, standard deviation of the second given structural parameter with respect to other specimens can be determined. This is however not limitative. If a second given structural parameter has been identified as stable over a plurality of specimens, then although it has been determined as impacting the one or more given electrical properties according to the impact criterion, an acquisition rate of data informative of this second given structural parameter does not need to be increased relative to an acquisition rate of other structural parameters (since its value can be predicted from other specimens). To the contrary, if the second given structural parameter has been identified as both impacting the given electrical property, and as varying among the specimens, its acquisition rate can be increased or set as larger than an acquisition rate of each of the other structural parameters.

As shown in FIG. 3 (see reference 340), according to some embodiments, the method of FIG. 3 can be repeated iteratively. In particular, once the recipe has been updated (operation 330), it can be reverted to operation 300, in which data acquisition is performed by the examination tool based on the recipe.

In some embodiments, operation 320 and 330 can be repeated, to further improve the recipe.

According to some embodiments, the method can include, after acquisition of data $D_{metrology/new}$ according to the latest update of the recipe, predicting (operation 350) at least one given electrical property of the specimen.

The recipe has enabled to selectively focus data acquisition on data $D_{metrology/new}$ which affect the given electrical property. Operation 350 can therefore include operations as described in FIG. 3B.

Figure 3B:
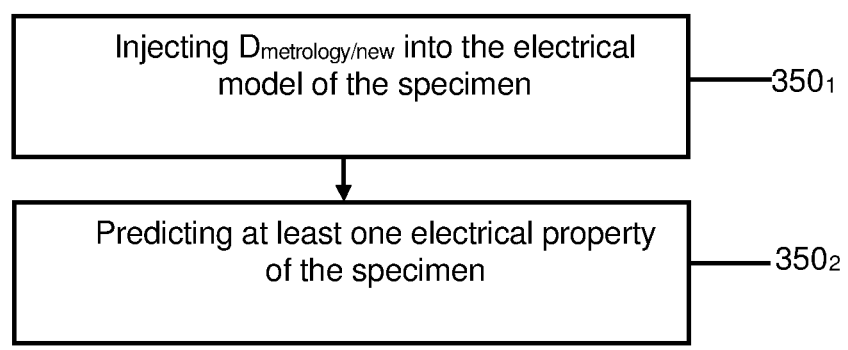
FIG. 3B illustrates a generalized flow-chart of a method of predicting one or more electrical properties of a specimen.

The method of FIG. 3B can include injecting (operation $350_1$) data $D_{metrology/new}$ informative of one or more structural parameters of the specimen, or variations thereof with respect to design data, into the electrical model.

The electrical model estimates at least one given electrical property associated with $D_{metrology/new}$ (operation $350_2$). A prediction of the given electrical property is therefore obtained, as requested. This prediction can be performed at several stages of the manufacturing process of the specimen, and for various layers of the specimen. This prediction can be performed even at an early stage of the manufacturing process of the specimen, and without requiring performing real electrical tests of the specimen.

As shown in FIG. 3, according to some embodiments, the method can use prediction of the at least one given electrical property to correct the manufacturing process (operation 360). Indeed, if it appears that the at least one given electrical property is expected to deviate from its design value, the method can include correcting one or more given structural parameters of the specimen which affect the given electrical property. According to some embodiments, this can include reworking a lithographic process of the specimen. In particular, this can include reworking the resist (also called photoresist) at the lithography stage. This is a cost-effective way to trigger a process correction, since the specimen (wafer) is not scrapped.

Figure 4:
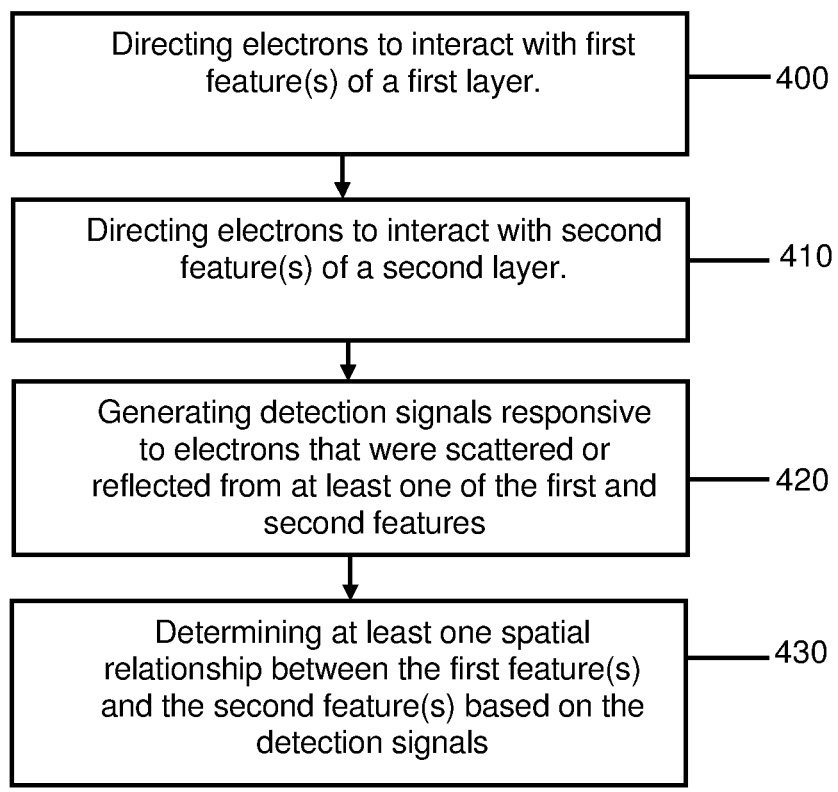
FIG. 4 illustrates a generalized flow-chart of a method of acquiring data informative of one or more structural parameters of a plurality of layers of a specimen.

Attention is now drawn to FIG. 4.

As explained with reference to operations 200 and 300, acquisition of data informative of a specimen is performed by an examination tool.

According to some embodiments, data acquisition can include the following operations, in compliance with the method described in U.S. Pat. No. 9,046,475 (incorporated herein by reference in its entirety).

Assume that the specimen includes at least two layers. A first layer includes a first three-dimensional feature which has been manufactured using a first lithographic process. A second three-dimensional feature is formed in a second layer buried under the first layer and formed by a second lithographic process prior to the first lithographic process.

The method includes performing a multi-step imaging sequence (using an electron beam examination tool, such as a SEM) to generate an image of at least a portion of the first and second features. This can include directing (operation 400) electrons of a primary electron beam to interact with the first feature during a first imaging step (e.g. so that the electrons of the primary electron beam have a landing energy of at least 2000 electron volts). The method further includes directing (operation 410) electrons of the primary electron beam to interact with the second feature during a second imaging step (e.g. so that the electrons of the primary electron beam have a landing energy of at least 5000 electron volts). The method further includes generating (operation 420) detection signals responsive to electrons that were scattered or reflected from at least one of the first and second features. The method can further include determining (operation 430) at least one spatial relationship between the first feature and the second feature based on the detection signals. This can include determining e.g. overlay between the two features. In some embodiments, the spatial relationship can be determined using information representative of the first feature. This information can be generated by directing electrons of the primary electron beam to interact with the first area without substantially interacting with the second area. This information can include e.g. width of the first feature(s). This is however not limitative.

In other words, this acquisition method enables acquiring data $D_{metrology}$ informative of a plurality of structural parameters across a plurality of layers of the specimen.

This acquisition method can be used in particular at operation 360. Indeed, since this acquisition method enables acquisition of structural parameters across a plurality of lithographic layers of the specimen, it can be used to rework one or more of the lithographic layers (which are generally manufactured by depositing a resistive material on a substrate/layer, exposing the resistive material by a photolithographic process, and developing the exposed resistive material to produce a pattern that defines some areas to be later etched). Since the photoresist sits on multiple layers deposited for the lithographic stage (e.g. hard mask, bottom anti reflective coating, which are later removed), underlayer alignment of the various layers is facilitated by the use of this acquisition method. As a consequence, it facilitates the reworking process of the lithographic layers.

It is to be understood that the invention is not limited in its application to the details set forth in the description contained herein or illustrated in the drawings.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. A system comprising at least one processor and memory circuitry (PMC), the at least one PMC being configured to:
  obtain metrology data $D_{metrology}$ informative of a plurality of structural parameters of a semiconductor specimen;
  obtain a model operative to:
    receive an input comprising one or more values for at least some of said structural parameters of the semiconductor specimen, and
    provide an output comprising a prediction for one or more electrical properties of the semiconductor specimen;
  use the model and $D_{metrology}$ to determine, for at least one given electrical property of the specimen, one or more given structural parameters among the plurality of structural parameters, which affect the at least one given electrical property more than one or more other structural parameters of the plurality of structural parameters; and
  generate a recipe for an examination tool, wherein the recipe enables a ratio between a first acquisition rate of data informative of the one or more given structural parameters, and a second acquisition rate of data informative of the one or more other structural parameters of the plurality of structural parameters, to meet a criterion.

2. The system of claim 1, wherein the recipe enables acquisition, by the examination tool, of an amount of data informative of each of the one or more given structural parameters which is larger than an amount of data informative of each of the other structural parameters of the plurality of structural parameters.

3. The system of claim 1, wherein the structural parameters include at least one of:
  parameters informative of a dimension of one or more structural features of the specimen,
  parameters informative of a shape of one or more structural features of the specimen,
  parameters informative of a location of one or more structural features of the specimen, and
  parameters informative of a material of one or more structural features of the specimen.

4. The system of claim 1, wherein an impact criterion is such that the one or more given structural parameters affect the at least one given electrical property more than other structural parameters of the plurality of structural parameters.

5. The system of claim 1, configured to:
  obtain electrical measurements informative of the at least one given electrical property of the specimen,
  use at least the electrical measurements and data informative of the one or more given structural parameters to verify whether the one or more given structural parameters affect the at least one given electrical property according to an impact criterion.

6. The system of claim 1, configured to:
  send a command to an examination tool to perform examination of said specimen using the recipe,
  obtain data informative of the one or more given structural parameters, and
  use the data and the model to predict the at least one given electrical property for the specimen.

7. The system of claim 1, configured to:
  send a command to an examination tool to perform examination of the specimen using the recipe,
  obtain data informative of the one or more given structural parameters, and
  use the data and the model to rework a lithographic process of the specimen.

8. The system of claim 1, configured to:
  send a command to an examination tool to perform examination of a new specimen using the recipe,
  obtain metrology data $D_{metrology/new}$ informative of a plurality of structural parameters of the specimen,
  use the model and $D_{metrology/new}$ to determine, for at least one given electrical property of the specimen, one or more second given structural parameters among the plurality of structural parameters, which affect the at least one given electrical property according to an impact criterion, and
  update the recipe for examination of the new specimen by the examination tool, wherein the recipe enables a ratio between a first acquisition rate of data informative of the one or more second given structural parameters, and a second acquisition rate of data informative of other structural parameters of the plurality of structural parameters, to meet a criterion.

9. The system of claim 8, configured to:
  send a command to the examination tool to perform examination of the new specimen according to the updated recipe,
  obtain data informative of the one or more second given structural parameters of the new specimen, and
  use the data and the model to predict the at least one given electrical property for the new specimen.

10. The system of claim 8, configured to:
  send a command to the examination tool to perform examination of the new specimen according to the updated recipe,
  obtain data informative of the one or more second given structural parameters,
  use the data and the model to rework a lithographic process of the new specimen.

11. The system of claim 1, wherein a ratio between the first acquisition rate of data informative of the one or more given structural parameters and the second acquisition rate of data informative of other structural parameters, depends on data informative of a variation of the one or more given structural parameters over a plurality of specimens.

12. The system of claim 1, wherein the specimen comprises a first feature formed in a first layer by a first lithographic process, a second feature formed in a second layer buried under the first layer and formed by a second lithographic process prior to the first lithographic process, the system being configured to control an examination tool to:
  direct electrons of a primary electron beam to interact with the first feature;
  direct electrons of the primary electron beam to interact with the second feature;
  generate detection signals responsive to electrons that were scattered or reflected from at least one of the first and second features, and
  determine at least one spatial relationship between the first feature and the second feature using at least the detection signals.

13. A method comprising, performed by a processor and memory circuitry (PMC), the method comprising:
  obtaining metrology data $D_{metrology}$ informative of a plurality of structural parameters of a semiconductor specimen;

obtaining a model operative to:
receive an input comprising one or more values for at least some of said structural parameters of the semiconductor specimen, and
provide an output comprising a prediction for one or more electrical properties of the semiconductor specimen;
using the model and $D_{metrology}$ to determine, for at least one given electrical property of the specimen, one or more given structural parameters among the plurality of structural parameters, which affect the at least one given electrical property more than one or more other structural parameters of the plurality of structural parameters; and
generating a recipe for an examination tool, wherein the recipe enables a ratio between a first acquisition rate of data informative of the one or more given structural parameters, and a second acquisition rate of data informative of the one or more other structural parameters of the plurality of structural parameters, to meet a criterion.

14. The method of claim 13, wherein the recipe enables acquisition, by the examination tool, of an amount of data informative of each of the one or more given structural parameters which is larger than an amount of data informative of each of the other structural parameters of the plurality of structural parameters.

15. The method of claim 13, wherein the structural parameters include at least one of:
parameters informative of a dimension of one or more structural features of the specimen,
parameters informative of a shape of one or more structural features of the specimen,
parameters informative of a location of one or more structural features of the specimen, and
parameters informative of a material of one or more structural features of the specimen.

16. The method of claim 13, wherein an impact criterion is such that the one or more given structural parameters affect the at least one given electrical property more than other structural parameters of the plurality of structural parameters.

17. The method of claim 13, comprising:
sending a command to an examination tool to perform examination of said specimen using the recipe,
obtaining data informative of the one or more given structural parameters, and
using the data and the model to predict the at least one given electrical property for the specimen.

18. The method of claim 13, comprising:
sending a command to an examination tool to perform examination of the specimen using the recipe,
obtaining data informative of the one or more given structural parameters, and
using the data and the model to rework a lithographic process of the specimen.

19. The method of claim 13, comprising:
sending a command to an examination tool to perform examination of a new specimen using the recipe,
obtaining metrology data $D_{metrology/new}$ informative of a plurality of structural parameters of the specimen,
using the model and $D_{metrology/new}$ to determine, for at least one given electrical property of the specimen, one or more second given structural parameters among the plurality of structural parameters, which affect the at least one given electrical property according to an impact criterion, and
updating the recipe for examination of the new specimen by the examination tool, wherein the recipe enables a ratio between a first acquisition rate of data informative of the one or more second given structural parameters, and a second acquisition rate of data informative of other structural parameters of the plurality of structural parameters, to meet a criterion.

20. A non-transitory computer readable medium comprising instructions that, when executed by a processor and memory circuitry (PMC), cause the PMC to perform operations comprising:
obtaining metrology data $D_{metrology}$ informative of a plurality of structural parameters of a semiconductor specimen;
obtaining a model operative to:
receive an input comprising one or more values for at least some of said structural parameters of the semiconductor specimen, and
provide an output comprising a prediction for one or more electrical properties of the semiconductor specimen;
using the model and $D_{metrology}$ to determine, for at least one given electrical property of the specimen, one or more given structural parameters among the plurality of structural parameters, which affect the at least one given electrical property more than one or more other structural parameters of the plurality of structural parameters; and
generating a recipe for an examination tool, wherein the recipe enables a ratio between a first acquisition rate of data informative of the one or more given structural parameters, and a second acquisition rate of data informative of the one or more other structural parameters of the plurality of structural parameters, to meet a criterion.

* * * * *